United States Patent
Ohki et al.

(10) Patent No.: US 10,608,407 B2
(45) Date of Patent: Mar. 31, 2020

(54) METHOD OF MANUFACTURING SEMICONDUCTOR LASER ELEMENT

(71) Applicant: FURUKAWA ELECTRIC CO., LTD., Tokyo (JP)

(72) Inventors: Yutaka Ohki, Tokyo (JP); Masafumi Tajima, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 16/013,987

(22) Filed: Jun. 21, 2018

(65) Prior Publication Data

US 2018/0316156 A1   Nov. 1, 2018

Related U.S. Application Data

(63) Continuation of application No. PCT/JP2016/088872, filed on Dec. 27, 2016.
(Continued)

(30) Foreign Application Priority Data

Aug. 23, 2016 (JP) .................................. 2016-162910

(51) Int. Cl.
*H01L 21/00* (2006.01)
*H01S 5/028* (2006.01)
(Continued)

(52) U.S. Cl.
CPC ............ *H01S 5/028* (2013.01); *H01S 5/0285* (2013.01); *H01S 5/16* (2013.01); *H01S 5/343* (2013.01)

(58) Field of Classification Search
None
See application file for complete search history.

(56) References Cited

U.S. PATENT DOCUMENTS

2005/0059181 A1   3/2005 Yamane et al.
2007/0054431 A1*  3/2007 Kamikawa ............. B82Y 20/00
                                                             438/39
(Continued)

FOREIGN PATENT DOCUMENTS

EP   1 043 765 A1   10/2000
JP   8-56053         2/1996
(Continued)

OTHER PUBLICATIONS

International Search Report dated Mar. 28, 2017 in PCT/JP2016/088872, filed on Dec. 27, 2016 ( with English Translation).
(Continued)

*Primary Examiner* — Evren Seven
(74) *Attorney, Agent, or Firm* — Oblon, McClelland, Maier & Neustadt, L.L.P.

(57) ABSTRACT

A method of manufacturing a semiconductor laser element includes: a cleaning process of holding a semiconductor light emission element that emits light from a facet thereof in a plasma sputtering device in which a target is covered with quartz, and cleaning the facet by irradiating the facet with plasma in the plasma sputtering device; and a dielectric film formation process of transporting the cleaned semiconductor light emission element to a deposition device without exposing the semiconductor light emission element to an atmosphere, and forming a dielectric film on the cleaned facet in the deposition device.

12 Claims, 5 Drawing Sheets

Related U.S. Application Data

(60) Provisional application No. 62/271,814, filed on Dec. 28, 2015.

(51) Int. Cl.
  *H01S 5/16* (2006.01)
  *H01S 5/343* (2006.01)

(56) References Cited

U.S. PATENT DOCUMENTS

| | | | | |
|---|---|---|---|---|
| 2007/0080368 A1* | 4/2007 | Kamikawa | ............. | B82Y 20/00 |
| | | | | 257/103 |
| 2007/0205424 A1* | 9/2007 | Kamikawa | ............. | B82Y 20/00 |
| | | | | 257/94 |
| 2007/0298528 A1 | 12/2007 | Yamane et al. | | |
| 2008/0089377 A1* | 4/2008 | Fukuda | ................... | H01S 5/028 |
| | | | | 372/49.01 |
| 2009/0052489 A1 | 2/2009 | Nomura | | |
| 2009/0236630 A1 | 9/2009 | Mochida et al. | | |

FOREIGN PATENT DOCUMENTS

| | | |
|---|---|---|
| JP | 9-162496 | 6/1997 |
| JP | 11-269643 | 10/1999 |
| JP | 2000-138215 | 5/2000 |
| JP | 2000-164969 | 6/2000 |
| JP | 2005-79406 | 3/2005 |
| JP | 2007-150004 | 6/2007 |
| JP | 2008-166852 | 7/2008 |
| JP | 2008-300547 | 12/2008 |
| JP | 2009-231470 | 10/2009 |
| JP | 2010-73757 | 4/2010 |

OTHER PUBLICATIONS

Written Opinion dated Mar. 28, 2017 in PCT/JP2016/088872, filed on Dec. 27, 2016.

Extended European Search Report dated Oct. 30, 2019 in Patent Application No. 16881766.6.

* cited by examiner

METHOD OF MANUFACTURING SEMICONDUCTOR LASER ELEMENT

CROSS-REFERENCE TO RELATED APPLICATION(S)

This application is based on a continuation of International Application No. PCT/JP2016/088872, filed on Dec. 27, 2016 which claims the benefit of priority of U.S. provisional Application No. 62/271,814, filed on Dec. 28, 2015, and the prior Japanese Patent Application No. 2016-162910, filed on Aug. 23, 2016, the entire contents of which are incorporated herein by reference.

BACKGROUND

The present disclosure relates to a method of manufacturing a semiconductor laser element.

In the related art, a semiconductor laser element that emits laser light from a facet thereof is manufactured by formation of a dielectric film, which is formed of a dielectric oxide, such as silicon oxide or aluminum oxide, on the facet of a semiconductor light emission element thereof, for adjustment of reflectivity thereof and the like. In this case, a technique for cleaning has been disclosed, in which impurities present on the facet are removed before the dielectric film is formed thereon, in order to keep generation of Catastrophic Optical Damage (COD) less on the facet and improve reliability of the semiconductor laser element. For example, in Japanese Laid-open Patent Publication No. 2000-164969 and Japanese Laid-open Patent Publication No. 2008-166852, by use of an Electron Cyclotron Resonance (ECR) sputtering device, first, cleaning is carried out by: generating plasma in a state where no high frequency power or bias is applied to a silicon target; and irradiating plasma to a facet to be cleaned. Thereafter, by use of the same ECR sputtering device, the silicon target is sputtered and a dielectric film made of silicon oxide is formed on the cleaned facet by generating plasma in a state where high frequency power or bias voltage is applied to the silicon target.

SUMMARY

There is a need for providing a method of manufacturing a semiconductor laser element with higher reliability.

According to an embodiment, a method of manufacturing a semiconductor laser element includes: a cleaning process of holding a semiconductor light emission element having a configuration that emits light from a facet thereof in a plasma sputtering device having a target covered with quartz, and cleaning the facet by irradiating the facet with plasma in the plasma sputtering device; and a dielectric film formation process of transporting the cleaned semiconductor light emission element to a deposition device without exposing the semiconductor light emission element to an atmosphere, and forming a dielectric film on the cleaned facet in the deposition device.

According to an embodiment, a method of manufacturing a semiconductor laser element includes: a cleaning process of holding a semiconductor light emission element having a configuration that emits light from a facet thereof in a plasma sputtering device having a target covered with aluminum oxide, and cleaning the facet by irradiating the facet with plasma in the plasma sputtering device; and a dielectric film formation process of transporting the cleaned semiconductor light emission element to a deposition device without exposing the semiconductor light emission element to an atmosphere, and forming a dielectric film on the cleaned facet in the deposition device.

According to an embodiment, a method of manufacturing a semiconductor laser element includes: a cleaning process of holding a semiconductor light emission element having a configuration that emits light from a facet thereof in a plasma sputtering device having at least a part formed of aluminum nitride, the part being of an inner wall surface of a path of plasma, or at least a part covered with aluminum nitride, the part being of an inner wall of the path of the plasma, and cleaning the facet by irradiating the facet with plasma in the plasma sputtering device; and a dielectric film formation process of transporting the semiconductor light emission element to a deposition device without exposing the semiconductor light emission element to an atmosphere, and forming a dielectric film on the cleaned facet in the deposition device.

According to an embodiment, a method of manufacturing a semiconductor laser element includes: a cleaning process of holding a semiconductor light emission element having a configuration that emits light from a facet thereof in a plasma sputtering device having at least a part formed of a member including a predetermined element and a target covered with the member, the part being of a path of plasma, and cleaning the facet by irradiating the facet with the plasma in the plasma sputtering device; and a dielectric film formation process of transporting the semiconductor light emission element to a deposition device without exposing the semiconductor light emission element to an atmosphere, and forming a dielectric film having the predetermined element as a constituent element thereof on the cleaned facet in the deposition device.

According to an embodiment, a method of manufacturing a semiconductor laser element includes: a cleaning process of holding a semiconductor light emission element having a configuration that emits light from a facet thereof in a plasma sputtering device having at least a target therein covered with a dielectric, and cleaning the facet by irradiating the facet with plasma in the plasma sputtering device; and a dielectric film formation process of transporting the semiconductor light emission element to a deposition device without exposing the semiconductor light emission element to an atmosphere, and forming a dielectric multilayer film on the cleaned facet in the deposition device, the dielectric multilayer film having different types of dielectric films layered over one another, the different types of dielectric films including a constituent element of the target as a common constituent element thereof.

According to an embodiment, a method of manufacturing a semiconductor laser element includes: a cleaning process of holding a semiconductor light emission element having a configuration that emits light from a facet thereof in a plasma cleaning device having a chamber inner wall formed of a dielectric, and cleaning the facet by irradiating the facet with plasma in the plasma cleaning device; and a semiconductor film formation process of transporting the cleaned semiconductor light emission element to a semiconductor deposition device without exposing the semiconductor light emission element to an atmosphere, and forming a semiconductor layer on the cleaned facet in the deposition device.

BRIEF DESCRIPTION OF THE DRAWINGS

The needs, features, advantages and technical and industrial significance of this disclosure will be better understood by reading the following detailed description of presently preferred embodiments of the disclosure, when considered in connection with the accompanying drawings.

DETAILED DESCRIPTION

In the related art, it has been found that the cleaning by generating plasma in the state where no high frequency bias voltage is applied to the target in the ECR sputtering device is not suitable for guarantee of reliability of the semiconductor laser element, since, for example, that cleaning may cause peeling of the dielectric film.

Hereinafter, with reference to the drawings, embodiments of a manufacturing method for a semiconductor laser element, according to the present disclosure, will be described in detail. Note that these embodiments do not limit the present disclosure. Further, the same or corresponding elements are designated with the same reference signs, as appropriate, throughout the drawings. Further, it needs to be noted that the drawings are schematic, and relations among dimensions of the respective elements may be different from the actual relations. Further, there may be portions having different dimensional relations and ratios among the drawings.

First Embodiment

Figure 1:
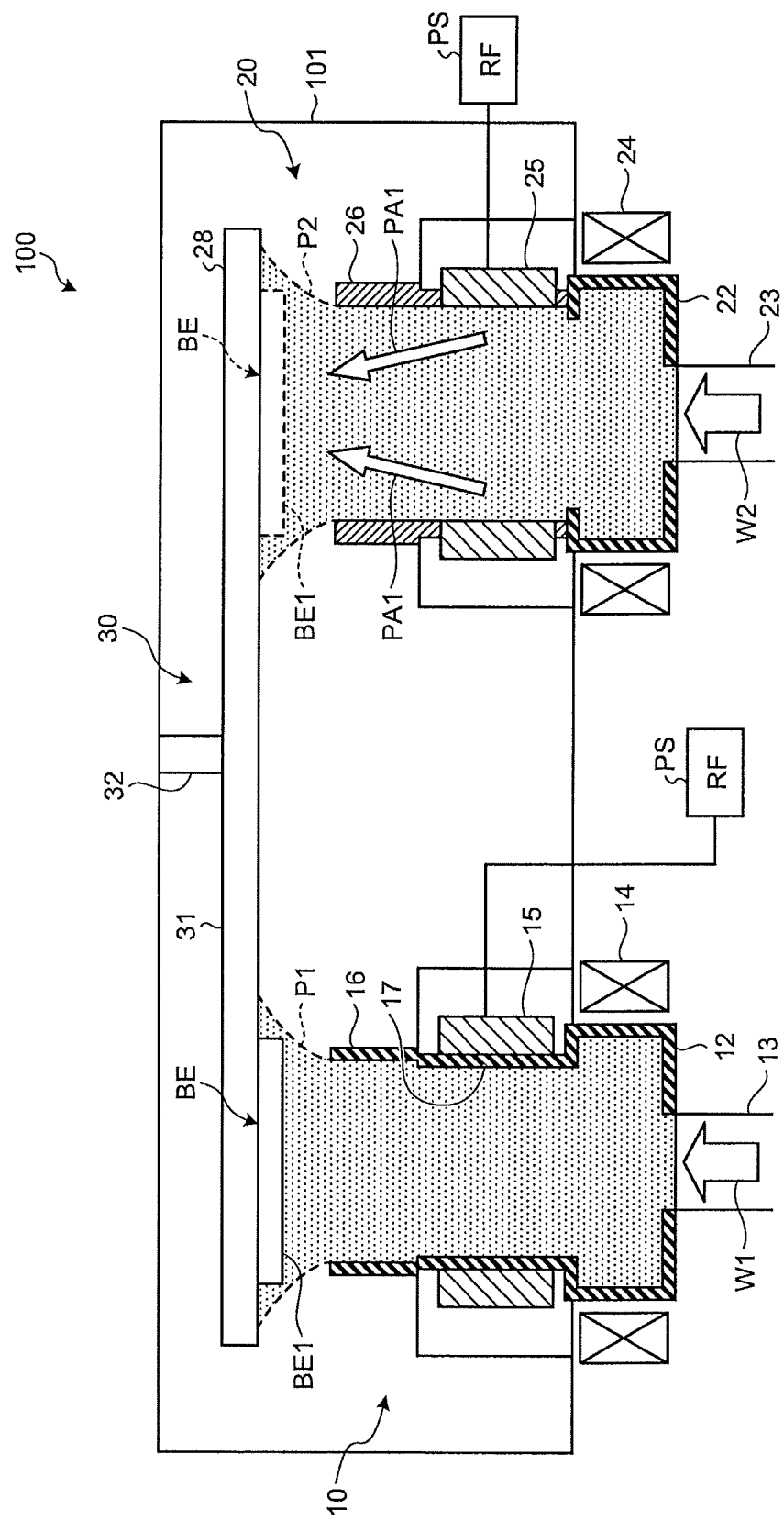
FIG. 1 is a schematic drawing of a treatment apparatus used in a manufacturing method according to a first embodiment.

FIG. 1 is a schematic drawing of a treatment apparatus used in a manufacturing method according to a first embodiment. The treatment apparatus 100 is an apparatus for making a semiconductor laser element by forming a dielectric film, which functions as a reflecting coating or an antireflecting coating, on a facet of a semiconductor light emission element. The treatment apparatus 100 includes: a cleaning device 10 that cleans the facet of the semiconductor light emission element; a deposition device 20 that forms the dielectric film on the facet of the cleaned semiconductor light emission element; a transport mechanism 30 that transports the semiconductor light emission element between the cleaning device 10 and the deposition device 20; and a vacuum chamber 101 that is for and shared by the cleaning device 10 and the deposition device 20. The vacuum chamber 101 has a gas introduction port, and a gas discharge port provided therein, for realization and maintenance of a vacuum state by discharge of gas in the vacuum chamber 101.

The cleaning device 10 includes: a plasma chamber 12 made of quartz; a waveguide 13 connected to the plasma chamber 12; a magnetic coil 14 arranged to surround an outer periphery of the plasma chamber 12; a target 15; an adhesion prevention tube 16 made of quartz; and a cover 17 that covers a surface of the target 15 and that is made of quartz.

Similarly, the deposition device 20 includes: a plasma chamber 22 made of quartz; a waveguide 23 connected to the plasma chamber 22; a magnetic coil 24 arranged to surround an outer periphery of the plasma chamber 22; a target 25 formed of a constituent element of the dielectric film to be formed; and an adhesion prevention tube 26 made of stainless steel.

Further, the waveguides 13 and 23 of the cleaning device 10 and the deposition device 20 are connected to a microwave generation device. Further, the targets 15 and 25 in the cleaning device 10 and the deposition device 20 are connected to high frequency (Radio Frequency (RF)) Power Sources PS.

That is, each of the cleaning device 10 and the deposition device 20 basically has a configuration of an ECR sputtering device, but the cleaning device 10 is different from the deposition device 20 in that the surface of the target 15 is covered by the cover 17 made of quartz and that the adhesion prevention tube 16 is made of quartz.

Further, the transport mechanism 30 includes: a plate 31 that is disk shaped; a rotating shaft 32 connected to the center of the plate 31; and a driving device, such as an electric motor, which is connected to the rotating shaft 32. The plate 31 is positioned above the cleaning device 10 and the deposition device 20, inside the shared vacuum chamber 101. The transport mechanism 30 is configured to be able to transport a bar element BE between the cleaning device 10 and the deposition device 20 without exposing the bar element BE to the atmosphere, by: a tray being fitted in the plate 31, the tray having a test piece (bar element BE) to be subjected to cleaning and deposition placed thereon; and the plate 31 being rotated by rotation of the rotating shaft 32 by the driving device.

Figure 2:
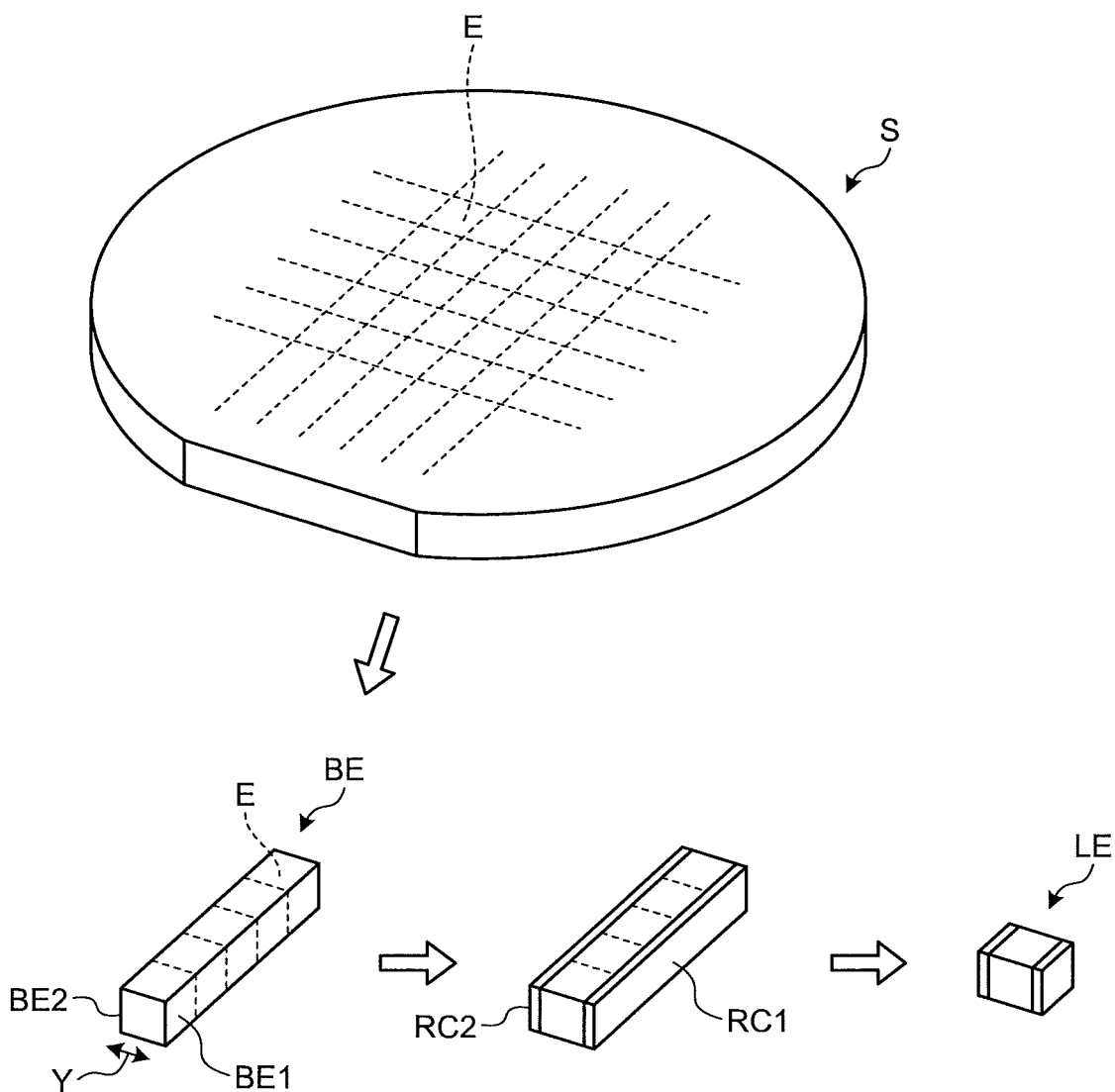
FIG. 2 is a drawing illustrating a manufacturing of a semiconductor laser element.

Next, the bar element BE will be described. FIG. 2 is a drawing illustrating manufacturing of a semiconductor laser element. First, multiple semiconductor light emission elements E are formed by: epitaxial growth of a semiconductor layer by a known method, such as a Metal Organic Chemical Vapor Deposition (MOCVD) method, on a surface ((001) surface) of a substrate S that is made of n-type gallium arsenide (GaAs), for example; fabrication of a predetermined waveguide structure by use of a photolithography technique and etching; and further formation of electrodes, dielectric protective coatings and the like.

Subsequently, the substrate S is cleaved, and thereby a bar element BE having plural semiconductor light emission elements E connected to one another one-dimensionally is fabricated. An optical waveguide of each of the semiconductor light emission elements E extends in a direction of an arrow Y. Therefore, opposite facets BE1 and BE2 of the bar element BE are end faces of the optical waveguide, and the semiconductor light emission elements E are configured to emit light from their facets BE1 and BE2.

When the bar element BE is fabricated by cleavage of the substrate S in the atmosphere, unnecessary films, such as natural oxide films, are generally known to be formed on the facets BE1 and BE2, each of the natural oxide films having a thickness of, for example, approximately several nanometers.

Subsequently, dielectric films RC1 and RC2 are respectively formed on the facets BE1 and BE2 of the bar element BE. Thereby, an optical resonator structure is formed in each of the semiconductor light emission elements E, and a semiconductor laser element is thereby formed. For example, the dielectric film RC1 functions as an antireflecting coating by a film thickness thereof being adjusted according to a refractive index of a material forming the dielectric film RC1, such that a reflectivity thereof at a wavelength of laser light to be emitted becomes, for example, 0.1% to 5%, preferably 0.5% to 2%, and specifically approximately 1%. A film thickness of the dielectric film RC2 is adjusted according to a refractive index of a material forming the dielectric film RC2. Specifically, the dielectric film RC2 functions as a high reflecting coating by the film thickness thereof being adjusted such that a reflectivity thereof at the wavelength of the laser light to be emitted becomes, for example, a reflectivity of 80% or higher, preferably 90% or higher, and specifically approximately 98%.

Subsequently, the bar element BE is cut into individual semiconductor laser elements LE. By the above described process, the semiconductor laser elements LE serving as single emitter elements are manufactured. The semiconductor laser elements LE emit laser light mainly from the dielectric film RC1 side.

Next, cleaning of the facets BE1 and BE2 and formation of the dielectric films RC1 and RC2, by use of the treatment apparatus 100, will be described.

First, the tray having the bar element BE placed thereon is fitted in the plate 31; and as illustrated in FIG. 1, the bar element BE is arranged at a position indicated in a solid line, that is, at the cleaning device 10 side.

Subsequently, a cleaning process is carried out. In the cleaning process, first, gas is supplied from a gas supply port, microwaves W1 are generated from a microwave power source, and a magnetic field is generated from the magnetic coil 14. By electron cyclotron resonance, plasma P1 is then generated from the supplied gas. This cleaning process is carried out in a state where voltage is not applied to the target 15. The facet BE1 of the bar element BE is irradiated with the plasma P1 generated. Thereby, the unnecessary film that has been formed on the facet BE1 is removed. The energy of the plasma P1 emitted is 10 eV to 25 eV, which is a suitable energy level that enables the natural oxide film to be removed while enabling damage to the semiconductor to be kept low. If the dielectric film RC1 is formed on the facet BE1 with the natural oxide film still having been formed on the facet BE1, reliability of the semiconductor laser element is decreased, and thus the natural oxide film is preferably removed by the cleaning process.

The plasma in the cleaning process is generated from gas including at least one type selected from, for example: hydrogen ($H_2$); hydrogen sulfide ($H_2S$); hydrogen chloride (HCl); chlorine ($Cl_2$); argon (Ar); xenon (Xe); and nitrogen ($N_2$). This gas is preferably reducing gas, and more preferably hydrogen gas. Use of plasma generated from mixed gas, such as a mixture of hydrogen gas and argon gas is effective, since both a reduction effect and an effect of mechanical removal of the oxide film are able to be expected in the cleaning. Further, more preferably, components of the plasma be in a state where a proportion of radicals to the components is greater than that of ions. The state where the proportion of radicals is larger is able to be made, for example, by installation of an ion trapper in the cleaning device.

Since the surface of the target 15 is covered by the cover 17 made of quartz, unintended adhering matter formed of the target material is prevented from adhering to the facet BE1, and thus the cleaning device 10 is suitable for realization of a semiconductor laser element having higher reliability.

Further, since all of the plasma chamber 12, the cover 17, and the adhesion prevention tube 16, which form a path of the plasma P1, are made of quartz, the cleaning device 10 is even more preferable.

Subsequently, a dielectric film formation process is carried out. First, the transport mechanism 30 transports the cleaned bar element BE to a position indicated in a broken line in FIG. 1, that is, the deposition device 20, without exposing the bar element BE to the atmosphere.

Subsequently, for example, in a case where the dielectric film is oxide, argon (Ar) gas and oxygen (O2) gas are supplied from a gas supply port of the vacuum chamber 101, microwaves W2 are generated from a microwave power source, and a magnetic field is generated from the magnetic coil 24. Plasma P2 is then generated. By RF bias voltage having been applied to the target 25 by the RF power source PS, the target 25 is sputtered with the plasma P2; particles PA1 of a material forming the target 25 are scattered and react with oxygen; a desired dielectric material produced by the reaction reaches the facet BE1; and the dielectric film RC1 is thereby formed.

The target 25 in the deposition device 20 is formed of, for example, aluminum (Al). If oxygen gas and argon gas are supplied, the dielectric film RC1 will be formed of aluminum oxide. The target 25 may be silicon (Si), titanium (Ti), tantalum (Ta), zirconium (Zr) or the like. If the target 25 is silicon, titanium, tantalum, or zirconium, the dielectric film RC1 will be formed of silicon oxide, titanium oxide, tantalum oxide, or zirconium oxide. In the case where the target 25 is silicon or aluminum, if nitrogen gas and argon gas are supplied from the gas supply port of the vacuum chamber 101, the dielectric film RC1 will be formed of silicon nitride or aluminum nitride. If only argon gas is supplied from the gas supply port of the vacuum chamber 101, the dielectric film RC1 will be formed of amorphous silicon.

After the formation of the dielectric film RC1, the bar element BE is taken out from the treatment apparatus 100, and cleaning of the facet BE2 and formation of the dielectric film RC2 are carried out by processes similar to the above described processes. Thereby, the semiconductor laser element LE having higher reliability is able to be obtained from the bar element BE.

Even when the surface of the target 15 is covered by the cover 17 made of quartz like in the cleaning device 10, quartz may adhere to the facet BE1 in the cleaning process. In this case, more preferably: the target 25 be formed of silicon, which is an element included in quartz; and the dielectric film RC1 is, for example, silicon oxide, silicon nitride, or amorphous silicon, which has silicon as a constituent element thereof. Thereby, the adhering matter and the dielectric film will include the same constituent element, congeniality therebetween will be improved, and thus, reliability will be improved by decrease in possibility of peeling of the dielectric film RC1 caused by the adhering matter.

Phenomena when plasma is generated and a facet of a semiconductor light emission element is cleaned in a state where a surface of a target is not covered by a cover and RF bias voltage is not applied to the target will be described in detail.

Experiments 1 and 2

Inventors of the present disclosure carried out the following experiment as an experiment 1. First, by use of a deposition device having the configuration of the deposition device 20 illustrated in FIG. 1 and including a target made of aluminum, a surface of a GaAs substrate was cleaned by generation of plasma in a state where RF bias voltage was not applied to the target; and subsequently, by use of a deposition device having the configuration of the deposition device 20 illustrated in FIG. 1 and including a target made of silicon, an amorphous silicon film was formed on the cleaned surface of the GaAs substrate by generation of plasma in a state where RF bias voltage was applied to the target. That is, in this experiment 1, the surface of the GaAs substrate is a target of the cleaning and the deposition, the surface corresponding to a facet of a semiconductor laser element.

In the cleaning, argon gas was supplied as gas. A composition of the surface of the GaAs substrate, on which the amorphous silicon film was formed, was analyzed by Auger Electron Spectroscopy (AES). The analysis by AES was carried out by measurement of a signal in a depth direction while sputtering on the substrate's surface was carried out.

Further, the inventors carried out, as an experiment 2, an experiment under the same conditions as those of the experiment 1, except that the cleaning was not performed in the experiment 2.

When the cleaning was carried out, a large amount of aluminum was present at an interface between the GaAs substrate and the amorphous silicon film. Further, oxygen, together with aluminum, was also detected, and oxygen that had been desired to be removed by cleaning increased more than when the cleaning was not carried out in the experiment 2. In this state, the surface of the GaAs substrate cannot be said to have been cleaned, and this state is not preferable.

Experiments 3 and 4

The inventors carried out the following experiment as an experiment 3. An experiment was carried out, in which: by use of a cleaning device having the configuration of the cleaning device 10 illustrated in FIG. 1, a surface of a GaAs substrate was cleaned by generation of plasma in a state where RF bias voltage was not applied to a target therein; and subsequently, by use of a deposition device having the configuration of the deposition device 20 illustrated in FIG. 1 and including a target made of aluminum, an aluminum oxide film was formed on the cleaned surface of the GaAs substrate by generation of plasma in a state where RF bias voltage was applied to the target.

In the cleaning, hydrogen gas was supplied as gas (hereinafter, cleaning using hydrogen plasma will be referred to as hydrogen cleaning). An electronic state of the surface of the GaAs substrate, on which the aluminum oxide film was formed, was analyzed by X-ray Photoelectron Spectroscopy (XPS), the electronic state being related to the $Ga2p_{3/2}$ orbit. In a practical semiconductor laser element, a film thickness of an aluminum oxide film formed on a facet thereof is, for example, equal to or greater than 100 nm for a monolayer film of aluminum oxide, but in this experiment, the film thickness was made as thin as 4 nm for the XPS analysis.

Further, the inventors carried out, as an experiment 4, an experiment under the same conditions as the experiment 3 except that the hydrogen cleaning was not performed in the experiment 4.

When the hydrogen cleaning was not carried out, a peak signal indicating Ga—O bonding due to the $Ga2p_{3/2}$ orbit (that is, covalent bonding between a gallium atom and an oxygen atom) was detected, but when the hydrogen cleaning was carried out, a peak signal indicating Ga—O bonding was hardly detected. From these results of the experiments 3 and 4, it has been found for the first time by these experiments that when the hydrogen cleaning is carried out in a state where a target in a cleaning device is covered, Ga—O bonding is considered to be not present on a surface of a GaAs substrate (at an interface between the surface and an aluminum oxide film), that is, the natural oxide film is considered to be removed by the hydrogen cleaning, and even if the aluminum oxide film is formed after the hydrogen cleaning, the surface of the GaAs substrate is considered to be not oxidized. As described above, when the natural oxide film is removed, and the surface of the semiconductor (corresponding to the facet of the semiconductor laser element) is not oxidized even if the dielectric film is formed, reliability of the semiconductor laser element becomes high.

Conventionally, it has been considered that for formation of a film on a semiconductor surface: when a non-oxide film, such as an aluminum nitride film, is formed, the semiconductor surface is not oxidized; but when an oxide film, such as an aluminum oxide film, is formed, the semiconductor surface is oxidized.

Experiments 5 and 6

The inventors carried out, as an experiment 5, an experiment under the same conditions as the experiment 3 except that argon cleaning using argon gas as gas was performed in the experiment 5. Further, the inventors carried out, as an experiment 6, an experiment under the same conditions as the experiment 5 except that argon cleaning was not performed in the experiment 6.

Similar to the experiments 3 and 4, when argon cleaning was not carried out, a peak signal indicating Ga—O bonding was detected, but when argon cleaning was carried out, a peak signal indicating Ga—O bonding was hardly detected. It is considered that these results of the experiments 5 and 6 indicate that when argon cleaning is carried out in a state where the target 15 is covered, the natural oxide film is removed by the argon cleaning, and that after the argon cleaning, the surface of the GaAs substrate is not oxidized even if the aluminum oxide film is formed thereon.

Second Embodiment

Next, a second embodiment will be described. A treatment apparatus used in a manufacturing method according to the second embodiment is the treatment apparatus 100 illustrated in FIG. 1, with the cleaning device 10 having been replaced with a cleaning device described below.

Figure 3:
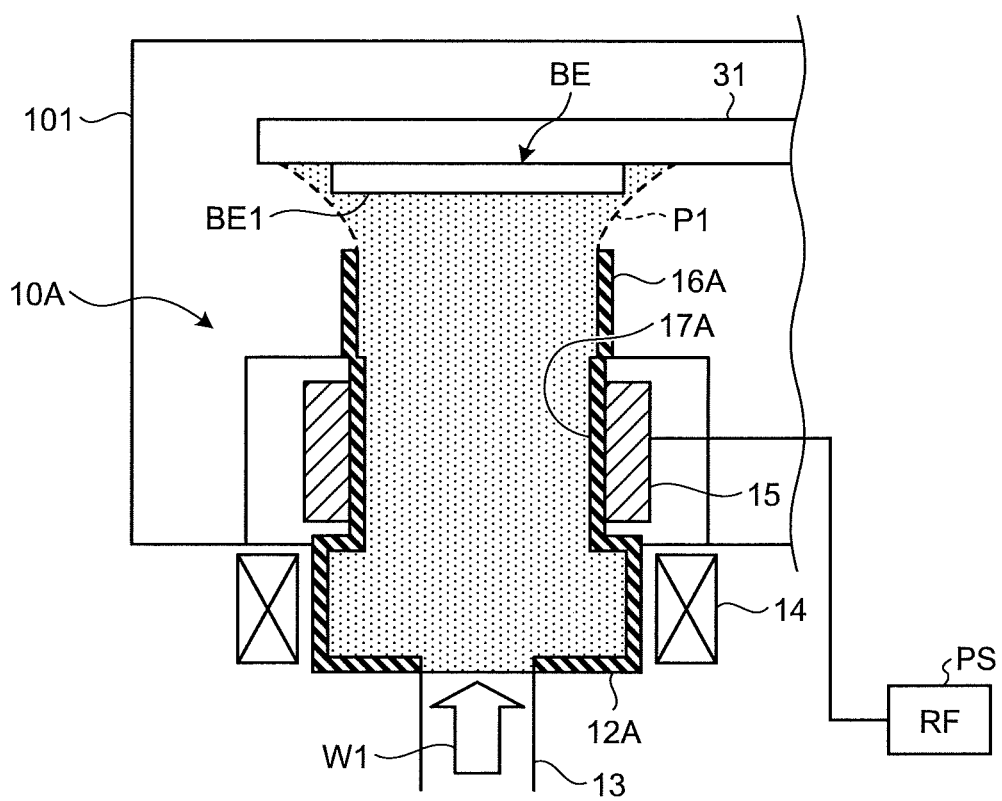
FIG. 3 is a schematic drawing of a cleaning device in a treatment apparatus used in a manufacturing method according to a second embodiment.

FIG. 3 is a schematic drawing of the cleaning device in the treatment apparatus used in the manufacturing method according to the second embodiment. A cleaning device 10A includes a plasma chamber 12A, an adhesion prevention tube 16A, and a cover 17A, in place of the plasma chamber 12, the adhesion prevention tube 16, and the cover 17, respectively, in the configuration of the cleaning device 10.

The plasma chamber 12A, the adhesion prevention tube 16A, and the cover 17A are all made of aluminum oxide. Therefore, use of the cleaning device 10A is, similar to the use of the cleaning device 10, suitable for realization of a semiconductor laser element having higher reliability. Further, since all of the plasma chamber 12A, the cover 17A, and the adhesion prevention tube 16A, which form a path of the plasma P1, are made of aluminum oxide, the cleaning device 10A is more preferable.

Further, as described above, quartz forming the path of plasma may be sputtered, the path including the cover of the target, but since the extent to which aluminum oxide is sputtered is less than that for quartz, the cleaning device 10A is more preferable in terms of prevention of generation of adhering matter. The path of plasma is, for example, all of places from the plasma chamber 12A to the plate 31 where the plasma moves, and in other words, a region where the plasma is present.

When the adhesion prevention tube 16A and the cover 17A that are made of aluminum oxide are included like in the cleaning device 10A, aluminum oxide may adhere slightly to the facet BE1 in the cleaning process. In this case, preferably, the target 25 is formed of aluminum, which is an element included in aluminum oxide, and the dielectric film to be formed is, for example, aluminum oxide or aluminum nitride, which has aluminum as a constituent element thereof. Thereby, the adhering matter and the dielectric film will include the same constituent element, congeniality therebetween will be improved, and thus, reliability is improved by decrease in possibility of peeling of the dielectric film caused by the adhering matter. Further, in a modified example of the second embodiment, the plasma chamber, the adhesion prevention tube, and the cover may be formed of titanium oxide, and in this case, a dielectric film to be formed is preferably, for example, titanium oxide having titanium as a constituent element thereof.

In FIG. 1, 39% of an inner wall of the path of the plasma from a bottom surface of the plasma chamber 22 to the bar element BE is formed of quartz in the deposition device 20. The inner wall referred to herein is the device's inner wall defining the path of the plasma, and is, for example, in the case of FIG. 1, an inner wall of the plasma chamber 22, the target 25, and the adhesion prevention tube 26, the inner wall being directed to the BE and along a vertical direction. For discussion of a percentage relative to the path of the plasma, the bottom surface of the plasma chamber 22 and the like are not considered. Further, the space between the adhesion prevention tube 26 and the BE in FIG. 1 and the like, are not considered, either. As to the cleaning device 10, in the device, in which 60% to 100% of the inner wall of the path of the plasma from the bottom surface of the plasma chamber 12 to the bar element BE had been formed of quartz, effects of the cleaning were confirmed. From the above, preferably, 40% or more of the inner wall of the path of the plasma is formed of quartz. More preferably, 60% or more of the inner wall of the path of the plasma is formed of quartz. Most preferably, 100% of the inner wall of the path of the plasma is formed of quartz. Similarly, in FIG. 3, preferably, 40% or more of an inner wall of the path of the plasma from a bottom surface of the plasma chamber 12A to the bar element BE is formed of aluminum oxide. More preferably, 60% or more of the inner wall of the path of the plasma is formed of aluminum oxide. Most preferably, 100% of the inner wall of the path of the plasma is formed of aluminum oxide.

Third Embodiment

Next, a third embodiment will be described. Hereinafter, a case where a dielectric film is peeled will be described in detail, and subsequently, a manufacturing method according to the third embodiment for prevention of peeling of the dielectric film will be described.

When the inventors carried out experiments for a multiple number of times and carefully examined results thereof, the inventors have found out for the first time this time that dielectric films may be easily peeled when the dielectric films are formed after the hydrogen cleaning.

Next, the manufacturing method according to the third embodiment for prevention of the peeling of the dielectric film will be described. The treatment apparatus 100 illustrated in FIG. 1 can be used in the manufacturing method according to the third embodiment.

Figure 4:
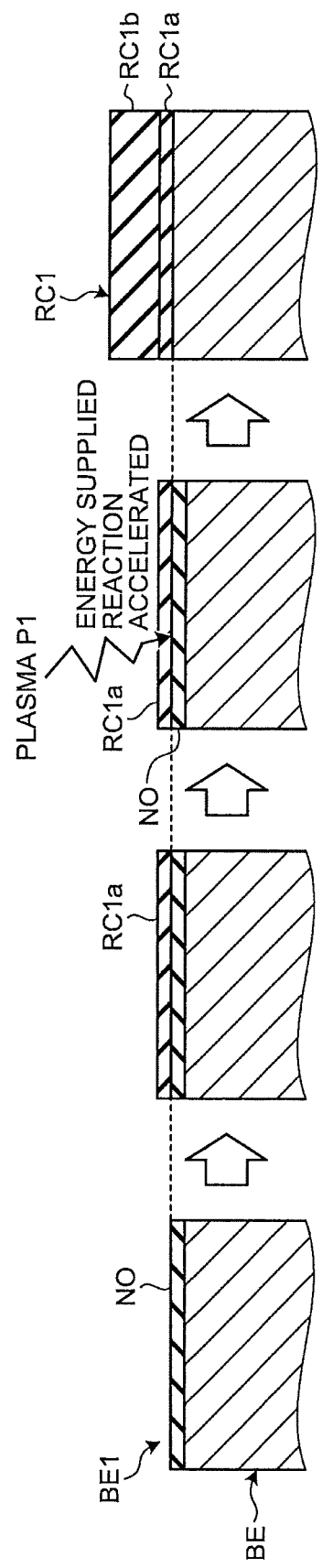
FIG. 4 is a drawing illustrating a manufacturing method according to a third embodiment.

FIG. 4 is a drawing illustrating the manufacturing method according to the third embodiment. As illustrated in FIG. 4, a natural oxide film NO is formed on the facet BE1 of the bar element BE. In the manufacturing method of the third embodiment, first, a thin oxide film formation process is executed, in which the bar element BE is positioned at the deposition device 20 side by the transport mechanism 30 and a dielectric film RC1a that is a thin oxide film is formed on the facet BE1 in the deposition device 20.

Subsequently, the bar element BE, on which the dielectric film RC1a has been formed, is transported to the cleaning device 10 by the transport mechanism 30, such that the bar element BE is not exposed to the atmosphere, and in the cleaning device 10, the facet BE1, on which the dielectric film RC1a has been formed, is irradiated with the plasma P1 that is hydrogen plasma, via the dielectric film RC1a. Thereby, the natural oxide film NO is removed. The natural oxide film NO is considered to be removed by: supply of the energy of the plasma P1 to an interface between the dielectric film RC1a and the natural oxide film NO via the dielectric film RC1a, which is a thin oxide film that is comparatively thin; and acceleration of a reaction, in which oxygen in the natural oxide film NO is gettered into the dielectric film RC1a. The ability to remove the natural oxide film NO by the irradiation with plasma after the formation of the dielectric film RC1a as described above has been found out for the first time this time through the investigation by the inventors.

Subsequently, the bar element BE with the facet BE1 having been cleaned is transported to the deposition device 20 by the transport mechanism 30, such that the bar element BE is not exposed to the atmosphere, and a dielectric film RC1b, which is a reflectivity adjustment dielectric film, is formed on the facet BE1 in the deposition device 20. The dielectric film RC1b and the dielectric film RC1a are preferably made of the same material in terms of adhesion between the dielectric film RC1b and the dielectric film RC1a, but may be made of materials different from each other. Thereby, the dielectric film RC1 that is made of the dielectric film RC1a and the dielectric film RC1b is formed. The dielectric film RC1b is a dielectric film that is comparatively thick, but since the dielectric film RC1b is formed, not on a semiconductor surface that has a risk of being decreased in adhesion by plasma cleaning, but in contact with the dielectric film RC1a, peeling is prevented. In particular, in the hydrogen cleaning, since plasma is emitted from above the dielectric film RC1a, the semiconductor surface becomes difficult to be terminated with hydrogen, and thus peeling is prevented.

The dielectric film RC1a, which is a thin oxide film, is preferably an oxide dielectric film selected from: aluminum oxide; silicon oxide; titanium oxide; tantalum oxide; and zirconium oxide. In view of gettering effectiveness of the interfacial oxygen and etching resistance to the plasma, aluminum oxide is most preferable among the oxide dielectric films. When the dielectric film RC1a is made of aluminum oxide, aluminum oxide having a higher Al composition ratio than that of an Al composition in $Al_2O_3$ that is a stoichiometric composition (that is, having a composition with less oxygen) is particularly preferably used, because the gettering effect on the interfacial oxygen upon the irradiation with plasma becomes very prominent. In the case where the thin oxide film is silicon oxide, titanium oxide, tantalum oxide, or zirconium oxide also, similarly, a composition ratio of silicon, titanium, tantalum, or zirconium is made higher than that of the stoichiometric composition (that is, a composition with less oxygen is adopted) preferably. The stoichiometric compositions of silicon oxide, titanium oxide, tantalum oxide, and zirconium oxide are respectively $SiO_2$, $TiO_2$, $Ta_2O_5$, and $ZrO_2$. Deviation of an oxide film from its stoichiometric composition as described above may be confirmed by its higher refractive index than that of the stoichiometric oxide film. Further, oxide dielectric films are preferable for being stable as dielectric films and having no problem of deterioration over a long time period, and are preferable for being high in transmittance with respect to laser light emitted by the semiconductor laser elements.

Nitride films are also dielectric films that are stable over a long time period. It has been found out from the investigation by the inventors that a nitride film deposited by use of plasma generated from gas including nitrogen is very easily peeled off from a facet of a semiconductor laser using a substrate made of GaAs and is not suitable as the dielectric film RC1a. However, such specific film peeling of nitride films is not observed on a facet of a semiconductor laser that is made of a nitride-group semiconductor material, such as, for example, GaN, which includes nitrogen in the semiconductor.

A film thickness of the dielectric film RC1a that is a thin oxide film preferably has: thinness enabling the plasma P1 to be transmitted therethrough; and thickness, by which effects of lessening of damage by the plasma and prevention of film peeling are demonstrated and manufacture reproducibility is made satisfactory. In view of the above, the film thickness of the dielectric film RC1a is preferably equal to or more than 0.1 nm and equal to or less than 30 nm.

Further, XPS analysis is suitable for confirmation of the natural oxide film NO removal effect as it is without change in the interface state between the semiconductor and the dielectric film RC1a. XPS analysis is suitable for, in view of its measurement limit, a case where the film thickness of the dielectric film RC1a is equal to or less than 8 nm. Therefore, for infallible confirmation of the natural oxide film NO removal effect, the film thickness of the dielectric film RC1a is more preferably equal to or more than 0.1 nm and equal to or less than 8 nm.

In a preferred example of the embodiment, hydrogen gas is supplied as gas for cleaning. Further, an aluminum oxide film serving as the dielectric film RC1a has a film thickness of 1 nm, and an aluminum oxide film serving as the dielectric film RC1b has a film thickness of 138 nm. The dielectric film RC1b may be a multiplayer film.

It has been considered conventionally that formation of an oxide dielectric film on a surface of a semiconductor causes the semiconductor to be oxidized. However, it has been found for the first time this time that in terms of the gettering effect of the oxide dielectric film and the plasma cleaning after the formation of the thin oxide film that is a comparatively thin oxide dielectric film, formation of a thin oxide film is preferable. Further, it has been found for the first time that a surface of a semiconductor that is reduced once by plasma cleaning is stable and is not oxidized thereafter when an oxide film is deposited on a thin oxide film.

Experiments 12 and 13

The inventors carried out the following experiment as an experiment 12. An experiment was carried out, in which: by use of a deposition device having the configuration of the deposition device 20 illustrated in FIG. 1 and including a target made of aluminum, an aluminum oxide film that is a thin oxide film was formed on a surface of a GaAs substrate having a natural oxide film formed thereon by generation of plasma in a state where RF bias voltage was applied to the target; subsequently, by use of a cleaning device having the configuration of the cleaning device 10 illustrated in FIG. 1, the GaAs substrate having the aluminum oxide film formed thereon was cleaned by generation of plasma in a state where RF bias voltage was not applied to the target; and subsequently, by use of the deposition device that formed the thin oxide film, an aluminum oxide film that is a reflectivity adjustment dielectric film was formed on the thin oxide film by generation of plasma in a state where RF bias voltage was applied to the target.

In the cleaning, hydrogen gas was supplied as gas. Further, the total film thicknesses of the aluminum oxide films were 4 nm; where film thicknesses of aluminum oxide films serving as thin oxide films were first made to be 0.3 nm, 1 nm, and 4 nm, and thereafter, for the 0.3 nm and 1 nm thin oxide films, aluminum oxide films serving as reflectivity adjustment dielectric films were formed thereon such that the total film thicknesses thereof became 4 nm. However, when the thin oxide film was 4 nm, a reflectivity adjustment dielectric film was not deposited thereon. This is for increasing the accuracy of the XPS measurement by making all of the total film thicknesses 4 nm under the respective conditions. When a semiconductor laser having appropriate reflectivity is actually made, the dielectric film needs to have a film thickness of approximately 100 nm.

Further, the inventors carried out, as an experiment 13, an experiment under the same conditions as the experiment 12 except that deposition of thin oxide films and the hydrogen cleaning were not carried out in the experiment 13.

An electronic state related to the $Ga2p_{3/2}$ orbit of the surface of the GaAs substrate was analyzed by XPS.

When the film thicknesses of the thin oxide films were 0.3 nm and 1 nm, peak signals indicating Ga—O bonding were hardly detected as compared to the case where the hydrogen cleaning was not carried out. These results are considered to indicate that the natural oxide films on the thin oxide films are removed by the hydrogen cleaning, and this indication was confirmed by these experiments for the first time this time. However, when the film thickness of the thin oxide film was 4 nm, a peak signal equivalent to that in the case where the hydrogen cleaning was not carried out was confirmed. Upon consideration of reasons therefor, it is considered that quartz is adhered in a thickness of approximately 1 nm by being sputtered at the time of cleaning since the target is covered by a cover made of quartz. It is presumed that it was difficult to cause the plasma to transmit through both the 4 nm thin oxide film and the adhered quartz predicted to be approximately 1 nm, and oxygen at the interface to be gettered into the thin oxide film. From the above results, the thin oxide film needs to be made to have thinness enabling plasma to be transmitted therethrough. For infallible removal of the natural oxide film even in a situation where quartz is unintentionally adhered, the film thickness of the thin oxide film is most preferably equal to or more than 0.1 nm and less than 4 nm.

Further, in view of the above, it is understood that unless a device configuration having a target covered by quartz like the first embodiment or second embodiment is adopted, a configuration, "thin oxide film→cleaning→reflectivity adjustment dielectric film", leads to even more unintended adhering matter, and the oxide removal effect will be unable to be demonstrated well.

Experiment 14

The inventors carried out the following experiment as an experiment 14. An experiment was carried out, in which: by use of a deposition device having the configuration of the deposition device 20 illustrated in FIG. 1 and including a target made of aluminum, an aluminum oxide film serving as a thin oxide film was formed on a surface of a bar element of a GaAs-group semiconductor light emission element having a natural oxide film formed thereon, by generation of plasma in a state where RF bias voltage was applied to the target; subsequently, by use of a cleaning device having the configuration of the cleaning device 10 illustrated in FIG. 1, the surface of the bar element having the aluminum oxide film formed thereon was cleaned, by generation of plasma in a state where RF bias voltage was not applied to the target; and subsequently, by use of the deposition device, an aluminum oxide film serving as a reflectivity adjustment dielectric film was formed on the cleaned surface of the bar element, by generation of plasma in a state where RF bias voltage was applied to the target.

In the cleaning, hydrogen gas was supplied as gas. Cleaning time periods were 30 seconds, 60 seconds, and 75 seconds. Further, as to the film thicknesses of aluminum oxide films, first, the film thicknesses of aluminum oxide serving as thin oxide films were 0.3 nm, 1 nm, and 4 nm, and thereafter, aluminum oxide films serving as reflectivity adjustment dielectric films were formed in a film thickness of 138 nm. Thereafter, thermal shock tests were carried out on the bar elements, on which the aluminum oxide films had been formed, and thereafter, states of the aluminum oxide films were investigated by use of micrographs thereof. Temperature cycling tests from room temperature (approximately 25° C.) to approximately 300° C. were carried out as the thermal shock tests.

Figure 5:
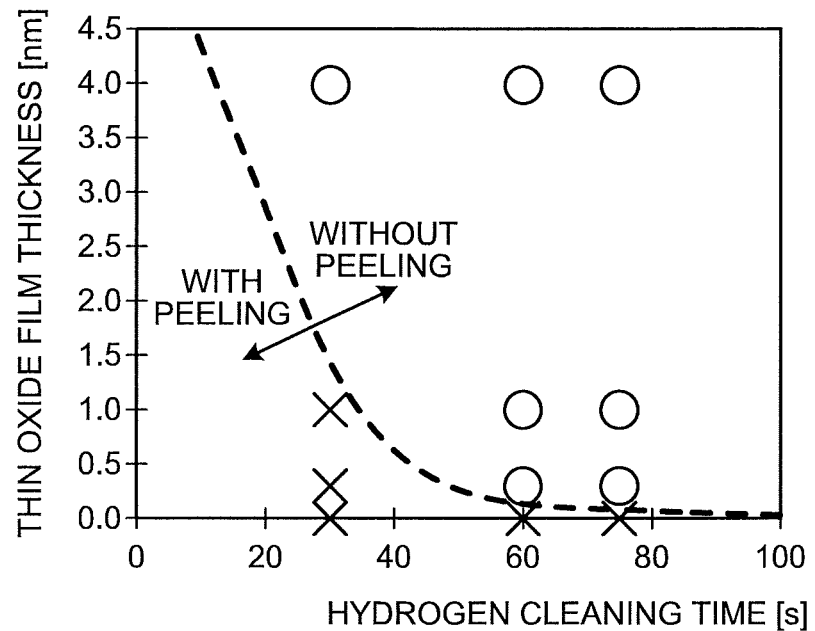
FIG. 5 is a drawing illustrating results of peeling tests for aluminum oxide films.

FIG. 5 is a drawing illustrating results of peeling tests for the aluminum oxide films. The horizontal axis represents the hydrogen cleaning time, and the vertical axis represents film thickness of aluminum oxide films serving as thin oxide films. In FIG. 5, circular marks represent data without peeling of the aluminum oxide films and cross marks represent data with peeling of the aluminum oxide films. The broken line indicates a boundary between "with peeling" and "without peeling", as a reference.

As seen in FIG. 5, the thicker the thin oxide film and the longer the cleaning time is, the less observed the peeling of the film is. However, if the thin oxide film is too thick, the natural oxide film removal effect is decreased. From the results of the experiments 12 and 13 and experiment 14, for infallible removal of the natural oxide film and prevention of peeling of the film even in the situation where quartz is unintendedly adhered, the film thickness of the thin oxide film is most preferably equal to or more than 0.3 nm and less than 4 nm, and the cleaning time is preferably equal to or more than 60 seconds.

Experiments 15 and 16

The inventors carried out experiments similar to the experiments 12 and 13, as experiments 15 and 16, by using a cleaning device having the configuration of the cleaning device 10A illustrated in FIG. 3 as a cleaning device.

In the cleaning, hydrogen gas was supplied as gas. Further, the total film thicknesses of aluminum oxide films were 4 nm; where film thicknesses of aluminum oxide films serving as thin oxide films were first made to be 0.3 nm, 1 nm, and 4 nm, and thereafter, for the 0.3 nm and 1 nm thin oxide films, aluminum oxide films serving as reflectivity adjustment dielectric films were formed thereon such that the total film thicknesses thereof became 4 nm. However, when the thin oxide film was 4 nm, a reflectivity adjustment dielectric film was not deposited thereon. This is for increasing the accuracy of the XPS measurement by making all of the total film thicknesses 4 nm under the respective conditions.

As compared to the results of the experiments 12 and 13, even when the film thickness of the aluminum oxide film serving as a thin oxide film was 4 nm, a peak signal indicating Ga—O bonding was hardly detected. Reasons for that are unknown, but it is considered that since the target was covered by a cover made of aluminum oxide in the cleaning device, the cover was hardly sputtered, and as a result, there was no adhering matter arising from the cover and plasma was able to transmit therethrough even if the film thickness of the thin oxide film was 4 nm.

As another reason therefor, it is considered that since plasma energy was efficiently used in removal of the natural oxide film without being used in sputtering of the inner wall of the cleaning device, the natural oxide film was able to be removed more than in the case where the cover was made of quartz like in the experiment 12, even by the irradiation with plasma from above the 4 nm thin oxide film that was thick. Therefore, under the conditions of the experiment 15, the film thickness of the thin oxide film may be more than 4 nm, and is preferably equal to or less than 30 nm enabling transmission of plasma, and more preferably equal to or less than 8 nm.

When the film thicknesses of the thin oxide films were 0.3 nm and 1 nm, deposition of the reflectivity adjustment dielectric films was carried out after plasma cleaning, but similar to the XPS analysis result for the case where deposition of a reflectivity adjustment dielectric film was not carried out and the film thickness was 4 nm, the natural oxide film was removed. That is, it is able to be understood from these results also that the removal of the oxide films by plasma cleaning is effective, influence by the deposition of the reflectivity adjustment dielectric film is little, and the semiconductor is not oxidized even if the reflectivity adjustment dielectric film is an oxide film. Conversely, from the description thus far, it can also be said that the case where the thin oxide film is 4 nm is different from the case where the thin oxide film is 0.3 nm or 1 nm in that a reflectivity adjustment dielectric film is not deposited, but there is no problem even if results of XPS for 0.3 nm, 1 nm, and 4 nm are compared in equal measure.

Fourth Embodiment

Next, a manufacturing method according to a fourth embodiment will be described. The treatment apparatus 100 illustrated in FIG. 1 can be used in the manufacturing method according to the fourth embodiment.

In the manufacturing method according to the fourth embodiment, first, hydrogen gas is supplied to the cleaning device 10, and the hydrogen cleaning is carried out on the bar element BE. Next, a plasma irradiation process is executed, in which, after hydrogen gas in the vacuum chamber 101 is discharged, plasma is generated by supply of gas including an element other than hydrogen, and a facet of the bar element BE that has been subjected to the hydrogen cleaning is irradiated with the plasma. Thereby, hydrogen that has been bonded to the surface of the semiconductor of the bar element BE is able to be removed. Thereafter, the bar element BE is transported to the deposition device 20, and formation of a dielectric film is carried out. By the execution of the plasma irradiation process between the cleaning and the formation of the dielectric film, the dielectric film is able to be formed to be adhered well to the surface of the semiconductor of the bar element BE.

Plasma irradiation in the plasma irradiation process is preferably irradiation of a short time period enabling hydrogen ends to be removed for lessening of damage to the bar element BE due to the plasma. Further, as the used gas, gas including an element that is difficult to be bonded to the semiconductor forming the bar element BE is preferably used. Such gas is preferably argon gas or xenon gas, which is inert gas.

Fifth Embodiment

Next, a manufacturing method according to a fifth embodiment will be described. In the manufacturing method according to fifth embodiment, an apparatus having a heating device (for example, a lamp heating device) provided in the cleaning device 10 in the treatment apparatus 100 illustrated in FIG. 1 can be used.

In the manufacturing method according to the fifth embodiment, first, hydrogen gas is supplied to the cleaning device 10, and the hydrogen cleaning is carried out on the bar element BE. Next, a high temperature holding process, in which the bar element BE is heated by the heating device and held at a predetermined temperature or higher, is executed. Thereby, hydrogen that has been bonded to the surface of the semiconductor of the bar element BE is able to be removed. Thereafter, the bar element BE is transported to the deposition device 20, and formation of a dielectric film is carried out. As described above, by the execution of the high temperature holding process between the cleaning and the formation of the dielectric film, the dielectric film is able to be formed to be adhered well to the surface of the semiconductor of the bar element BE.

The temperature held in the high temperature holding process is a temperature that enables the hydrogen bonded to the surface of the semiconductor of the bar element BE to be removed and that is lower than the growth temperature of the semiconductor, and is, for example, preferably 100° C. to 400° C.

Sixth Embodiment

Next, a sixth embodiment will be described. As an apparatus used in a manufacturing method according to the sixth embodiment, the treatment apparatus used in the manufacturing method according to the first or second embodiment can be used, but hereinafter, a case where the treatment apparatus used in the manufacturing method according to second embodiment is used will be described.

In the manufacturing method according to the sixth embodiment, first, a cleaning process is executed by irradiation of the facet BE1 of the bar element BE with the plasma P1 in the cleaning device 10A. Subsequently, the bar element BE is transported to the deposition device 20, and a dielectric film formation process is executed. A dielectric film formed then is a dielectric multilayer film formed of different types of dielectric films layered over one another, the dielectric films including a constituent element of the target 25 in the deposition device 20 as a common constituent element thereof. For example, if a constituent element of the target 25 is aluminum, the dielectric multilayer film is formed of an aluminum oxide film and an aluminum nitride film layered over each another, the aluminum oxide film and aluminum nitride film including aluminum as their common constituent element.

By utilization of the dielectric multilayer film as a dielectric film formed on the facet of the semiconductor light emission element, low reflectivity, that is unable to be realized with a monolayer, is able to be realized. However, when, for example, a multilayer film formed of an aluminum oxide film and a silicon nitride film is attempted to be formed as the dielectric multilayer film, two different targets of aluminum and silicon are needed in the deposition device. When different types of targets are used as such, the device may be increased in size and complexity, because after a dielectric film is formed first in the deposition device including a certain type of target, there is a need for the vacuum to be broken once and another deposition device including another type of target to be used, or there is a need for another ECR source in the same device.

A dielectric multilayer film having an aluminum oxide film with a film thickness of 90 nm and an aluminum nitride film with a film thickness of 30 nm that are layered over each other in this order on a facet of a semiconductor light emission element is one of preferable examples of the dielectric multilayer film. With such a dielectric multilayer film, a reflectivity of 1.0% at a wavelength of 976 nm is able to be realized. A lower limit of reflectivity is approximately 1.6% at a wavelength of 976 nm for a monolayered aluminum oxide film, but by the dielectric film being made multilayered, a lower reflectivity is able to be realized.

For formation of another type of dielectric film with a single type of target in the deposition device 20, the type of gas to be supplied from the gas supply port of the vacuum chamber 101 may be changed. For example, if the target is made of aluminum, by supply of oxygen gas, an aluminum oxide film is able to be formed, and by supply of nitrogen gas, an aluminum nitride film is able to be formed.

Seventh Embodiment

Next, a seventh embodiment will be described. A technique, for depositing a semiconductor film having a bandgap wavelength shorter than a desired laser emission wavelength, such as zinc selenide (ZnSe), on a facet of a semiconductor light emission element, has been known as one of techniques for improving reliability. Such a technique is called Epitaxial Mirror on Facet (EMOF), or the like. According to diligent investigation by the inventors, it has been found for the first time that there is a problem that unless the natural oxide film formed on the facet is removed also before EMOF is executed, stacking faults are generated in the semiconductor film (EMOF film) formed and the intended effect of improving the reliability is not obtained. A manufacturing method according to this seventh embodiment enables this problem to be suitably solved.

Figure 6:
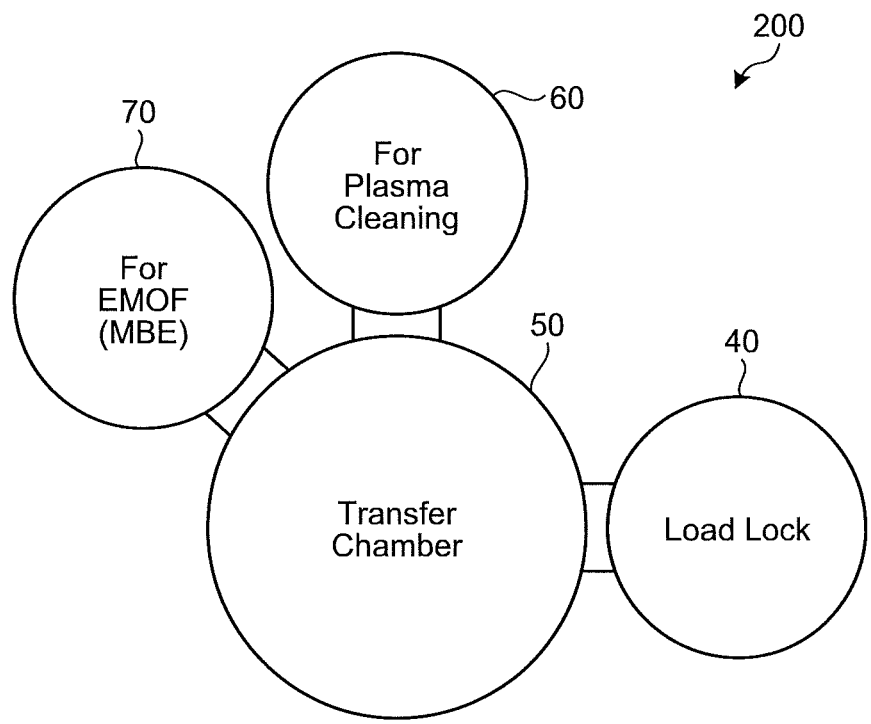
FIG. 6 is a schematic drawing of a treatment apparatus used in a manufacturing method according to a seventh embodiment.

FIG. 6 is a schematic drawing of a treatment apparatus used in the manufacturing method according to the seventh embodiment. This treatment apparatus 200 includes a load lock 40, a transfer chamber 50, a cleaning device 60, and a semiconductor deposition device 70.

The load lock 40 is for introducing a bar element of a semiconductor light emission element into the treatment apparatus 200. The transfer chamber 50 is a chamber including a transport mechanism that transfers the introduced bar element mutually among the load lock 40, the cleaning device 60, and the semiconductor deposition device 70, without exposing the bar element to the atmosphere. The cleaning device 60 is a plasma cleaning device having a chamber inner wall formed of a dielectric. The semiconductor deposition device 70 is a molecular beam epitaxy (MBE) device.

Conventionally, for ease of manufacture of the device, the chamber inner wall of this type of plasma cleaning device has been metallic. However, it has been found that when the inner wall is metallic, hydrogen plasma goes into the metal and is turned into hydrogen in the ground state, and effects of the hydrogen cleaning are unable to be demonstrated sufficiently. In contrast, since the chamber inner wall of the cleaning device 60 is formed of a dielectric, the hydrogen cleaning effects are able to be demonstrated sufficiently. The dielectric forming the chamber inner wall is preferably, for example, aluminum nitride, aluminum oxide, silicon oxide, or the like. Further, plasma to be used in the cleaning is generated from gas including at least one type selected from, for example: hydrogen; hydrogen sulfide; hydrogen chloride; chlorine; argon; xenon; and nitrogen. This gas is preferably reducing gas, and more preferably hydrogen gas. Even more preferably, components of the plasma are in a state where there are more hydrogen radicals than hydrogen ions.

In the manufacturing method according to the seventh embodiment, first, a bar element, on which an EMOF film is to be formed, is introduced from the load lock 40. The transport mechanism of the transfer chamber 50 transports the bar element to the cleaning device 60. The cleaning device 60 carries out cleaning by removing a natural oxide film on a facet of the bar element through irradiation with plasma. Subsequently, the transport mechanism of the transfer chamber 50 transports the bar element to the semiconductor deposition device 70 without exposing the bar element to the atmosphere. The semiconductor deposition device 70 forms an EMOF film on the cleaned facet. As described above, the EMOF film is continuously formed without the semiconductor light emission element being exposed to the atmosphere. Thereafter, the bar element is transported out from the load lock 40 via the transfer chamber 50.

A waveguide mode of the semiconductor laser element manufactured by the manufacturing method according to each of the above described embodiments may be a multi-mode or a single-mode. Further, the form of the semiconductor laser element is not limited to the form that has been cut into the single emitter element as illustrated in the right bottom portion of FIG. 2, and may be in the form of the bar element illustrated in the center bottom portion of FIG. 2. Further, the waveguide structure of the semiconductor laser element manufactured by the manufacturing method according to each of the above described embodiments is not particularly limited. Application to a well known ridge waveguide, a Buried Heterostructure (BH), a gain waveguide, or the like is possible.

Further, in the manufacturing method according to each of the above described embodiments, the semiconductor light emission element may have a window structure formed on a facet thereof by a known impurity free vacancy disordering method. In a semiconductor laser element having an emission wavelength of approximately 850 nm to 1070 nm: a quantum well layer is made of, for example, indium gallium arsenide; and a barrier layer therearound is made of, for example, aluminum gallium arsenide. The substrate is a GaAs substrate; and on the substrate: an n-cladding layer, an n-separate confinement heterostructure (n-SCH) layer, a barrier layer, a quantum well layer, and a barrier layer, which have n-type conductivity; and a p-SCH layer, a p-cladding layer, a p-contact layer and the like, which have p-type conductivity, are layered. From detailed investigation, it has been revealed that a quantum well layer that has been turned into a window structure by the IFVD method is naturally oxidized more easily than a quantum well layer that has not been turned into a window structure by the IFVD method. When the optical power of the semiconductor laser element is low, even if such natural oxidation occurs, high reliability is able to be maintained due to effects of the IFVD. However, with the increase in the optical power of semiconductor laser elements, increase in the reliability has been demanded. It has been found that when interfacial oxygen is removed by plasma cleaning of a semiconductor light emission element having a window structure due to IFVD and a semiconductor laser element is formed by formation of a dielectric film thereafter, there is a large effect on improvement of reliability that has not been able to be easily imagined thus far. As to the optical power, the effect of combining the IFVD method and the plasma cleaning becomes evident: from optical power greater than 500 mW in a semiconductor laser element having a waveguide mode of a single-mode; and from optical power greater than 5 W in a semiconductor laser element having a waveguide mode of a multi-mode.

In the above described second embodiment, the plasma chamber 12A, the adhesion prevention tube 16A, and the cover 17A, of the cleaning device 10A are all made of aluminum oxide, but at least a part of the plasma chamber 12A and adhesion prevention tube 16A may be made of aluminum nitride, or an inner wall surface of a portion forming the path of the plasma may be formed of a member coated with aluminum nitride, the portion being the plasma chamber, the adhesion prevention tube, the cover, and the like. However, forming the portion serving as the path of the plasma by use of a member formed of aluminum nitride itself is not necessarily preferable in view of ease of manufacture and mechanical strength.

Further, in the above described third embodiment, the dielectric film RC1*a* and the dielectric film RC1*b* are formed by the same deposition device, but the dielectric film RC1*a* and the dielectric film RC1*b* may be formed by different deposition devices.

Further, in the sixth embodiment, the multilayer film formed of different types of dielectric films is formed by use of a single type of target, but in implementing the manufacturing methods according to the other embodiments of the present disclosure, a deposition device including different types of targets may be used, or plural deposition devices having different types of targets may be used.

Further, in the above described embodiments, the substrates are cleaved in the atmosphere, but the present disclosure may also be applicable to a facet of a semiconductor light emission element that has been cleaved in a vacuum. Furthermore, the plasma cleaning in the above described embodiments may be carried out on the facet BE1 side only, the facet BE1 serving as a main emission facet of the semiconductor light emission element, or may be carried out on both of the facet BE1 and the facet BE2 that is a rear facet. The plasma cleaning is preferably carried out on both of the facets since reliability is increased thereby. For the reflectivity of the rear facet to be increased, the rear facet is generally formed of a thick multilayer film. Generally, for example, while the film thickness of the dielectric film of the emission facet is approximately 100 nm, the film thickness of the multilayer film of the rear facet is approximately 1000 nm. A dielectric film is easily peeled from a facet that has been subjected to the hydrogen cleaning, and when the film thickness of the dielectric film is increased, the dielectric film is more easily peeled. Therefore, when the hydrogen cleaning is carried out in particular, preferably, the film thickness is made thin and the hydrogen cleaning is carried out only on the emission facet where on-facet COD easily occurs, in terms of both prevention of film peeling and improvement of reliability.

Further, in the above described embodiments, each of the cleaning devices 10 and 10A, and the deposition device 20 basically has a configuration of an ECR sputtering device, but a configuration of a cleaning device and a deposition device applicable to a manufacturing method of the present disclosure is not limited to the configuration of the ECR sputtering device, and the cleaning device and the deposition device may have a configuration of a high frequency magnetron sputtering device, a plasma CVD device, or a helicon wave plasma sputtering device.

The present disclosure is not limited by the above described embodiments. Those configured by combination of the respective components described above as appropriate are also included in the present disclosure. Furthermore, further effects and modifications can be derived easily by those skilled in the art. Therefore, wider aspects of the present disclosure are not limited to the above described embodiments, and various modifications are possible.

According to the present disclosure, an effect can be achieved that a semiconductor laser element with higher reliability is obtained.

The invention claimed is:

1. A method of manufacturing a semiconductor laser element, the method including:
    holding a semiconductor light emission element that emits light from a facet thereof in a plasma sputtering device in which a target is covered with aluminum oxide that is physically formed in advance to cover the target, and cleaning the facet by irradiating the facet with plasma in the plasma sputtering device; and
    transporting the cleaned semiconductor light emission element to a deposition device without exposing the semiconductor light emission element to an atmosphere, and forming a dielectric film on the cleaned facet in the deposition device.

2. The method of manufacturing the semiconductor laser element according to claim 1, wherein at least a part of an inner wall of a path of the plasma is formed of aluminum oxide, or at least a part of an inner wall surface of the path of the plasma is covered with aluminum oxide.

3. The method of manufacturing the semiconductor laser element according to claim 2, wherein 40% or more of the inner wall is formed of aluminum oxide, or 40% or more of the inner wall is covered with aluminum oxide.

4. The method of manufacturing the semiconductor laser element according to claim 2, wherein 60% or more of the inner wall is formed of aluminum oxide, or 60% or more of the inner wall is covered with aluminum oxide.

5. The method of manufacturing the semiconductor laser element according to claim 2, wherein 100% of the inner wall is formed of aluminum oxide, or 100% of the inner wall is covered with aluminum oxide.

6. The method of manufacturing the semiconductor laser element according to claim 1, further including:
    forming a thin oxide film on the facet in the deposition device before holding the semiconductor light emission element and cleaning the facet, wherein
    the semiconductor light emission element having the thin oxide film formed thereon is transported to the plasma sputtering device without being exposed to the atmosphere, and the holding and cleaning are executed on the facet via the thin oxide film, and
    the dielectric film is formed on a surface of the thin oxide film.

7. The method of manufacturing the semiconductor laser element according to claim 6, wherein a thickness of the thin oxide film is in a range equal to or more than 0.1 nm and equal to or less than 30 nm.

8. The method of manufacturing the semiconductor laser element according to claim 6, wherein a/the thickness of the thin oxide film is in a range equal to or more than 0.3 nm and less than 4 nm, and the cleaning process is executed for 60 seconds or more.

9. The method of manufacturing the semiconductor laser element according to claim 6, wherein the thin oxide film has a composition with less oxygen than a stoichiometric composition thereof.

10. The method of manufacturing the semiconductor laser element according to claim 6, wherein the thin oxide film includes one type selected from: aluminum oxide; silicon oxide; titanium oxide; tantalum oxide; and zirconium oxide.

11. The method of manufacturing the semiconductor laser element according to claim 1, wherein the semiconductor light emission element includes a window structure formed on the facet by an impurity-free vacancy disordering (IFVD) method.

12. The method of manufacturing the semiconductor laser element according to claim 6, wherein the semiconductor light emission element includes a window structure formed on the facet by an impurity-free vacancy disordering (IFVD) method.

* * * * *